United States Patent
Fuse et al.

(10) Patent No.: US 8,148,970 B2
(45) Date of Patent: Apr. 3, 2012

(54) REFERENCE CURRENT GENERATING CIRCUIT

(75) Inventors: Tsuneaki Fuse, Tokyo (JP); Masaki Ichikawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 226 days.

(21) Appl. No.: 12/719,320

(22) Filed: Mar. 8, 2010

(65) Prior Publication Data

US 2011/0050196 A1  Mar. 3, 2011

(30) Foreign Application Priority Data

Sep. 2, 2009  (JP) .................................. 2009-203111

(51) Int. Cl.
*G05F 3/20* (2006.01)

(52) U.S. Cl. ........................................................ 323/313

(58) Field of Classification Search .......... 323/311–314; 327/539, 543
See application file for complete search history.

(56) References Cited

U.S. PATENT DOCUMENTS

| | | | |
|---|---|---|---|
| 5,631,600 A * | 5/1997 | Akioka et al. ................ 327/543 |
| 6,501,299 B2 * | 12/2002 | Kim et al. ....................... 326/83 |
| 6,583,744 B2 * | 6/2003 | Bright ............................ 341/145 |
| 6,683,490 B2 * | 1/2004 | Kaminishi .................... 327/538 |
| 6,873,143 B2 * | 3/2005 | Moon et al. ................... 323/312 |
| 7,646,661 B2 * | 1/2010 | Koga et al. .................... 365/222 |
| 7,893,728 B2 * | 2/2011 | Hirai ............................. 327/103 |
| 2005/0275457 A1 * | 12/2005 | Fattaruso ...................... 330/252 |
| 2007/0274138 A1 * | 11/2007 | Ogiwara et al. ......... 365/189.09 |
| 2008/0094050 A1 * | 4/2008 | Sugai et al. ................... 323/316 |

FOREIGN PATENT DOCUMENTS

| | | |
|---|---|---|
| JP | 4-507320 | 12/1992 |
| JP | 2007-512639 | 5/2007 |
| JP | 2008-192232 | 8/2008 |

OTHER PUBLICATIONS

Japanese Office Action for Application No. 2009-203111 issued on Sep. 20, 2011.

* cited by examiner

*Primary Examiner* — Adolf Berhane
(74) *Attorney, Agent, or Firm* — Turocy & Watson, LLP

(57) ABSTRACT

A reference current generating circuit includes first and second standard current generating circuits to generate first and second standard currents, respectively and first and second trimming circuits to generate first and second reference circuits by trimming the standard current values outputted from the standard current generating circuits. The second standard current generating circuit operates for a part of an operation period of the first standard current generating circuit. The value of the first reference current is compared with a value of the second reference current, and controlled so as to approach the value of the second reference current by a trimming controller.

19 Claims, 5 Drawing Sheets

REFERENCE CURRENT GENERATING CIRCUIT

CROSS-REFERENCE TO RELATED APPLICATION

This application is based upon and claims the benefit of priority from prior Japanese Patent Application No. 2009-203111, filed Sep. 2, 2009, the entire contents of which are incorporated herein by reference.

BACKGROUND OF THE INVENTION

1. Field of the Invention

The invention relates to a reference current generating circuit, particularly to a reference current generating circuit capable of compensating a deviation of a standard current from a preset value due to aged deterioration of the circuit.

2. Description of the Background Art

With increasing miniaturization of semiconductor devices in recent years, a phenomenon has come to the fore in which a threshold voltage Vth of a field effect transistor is increased with time due to Hot Carrier Injection (HCI) and Negative Bias Temperature Instability (NBTI). As a result of the increased threshold voltage Vth of the field effect transistor, the current of the field effect transistor is decreased and the characteristics of the semiconductor device are deteriorated. Accordingly, when designing an integrated circuit board in which highly miniaturized field effect transistors are used, it is necessary to consider the deterioration of characteristics of the field effect transistor at the End Of Life (EOL).

A sense circuit for a flash memory determines read data to be "1" when a cell current is larger than a standard current, and determines the read data to be "0" when a cell current is smaller than the standard current. Here, a memory cell is called "on-cell" when "1" is stored in the memory cell, and is called "off-cell" when "0" is stored in the memory cell.

A memory cell array in which such memory cells are arranged in a matrix has on-cell and off-cell currents which are distributed within certain ranges due to variation in characteristics of each memory cell. Consequently, the value of the standard current to be compared with the memory cell current is desirably set in an intermediate range between the lower limit of the on-cell current distribution and the upper limit of the off-cell current distribution.

To achieve such setting, current trimming has been performed for each chip with a conventional reference current generating circuit before shipment of the chips, so that the value of the standard current is set within the intermediate range. After the trimming data has been stored in a register built in a reference current generating circuit, the chip is shipped.

Japanese Patent Application Publication No. 2008-192232, for example, discloses a method of adjusting a reference level of a reference cell used for programming and reading of data to and from a nonvolatile memory cell. The method can thereby reduce shift of a reference level of the reference cell which would occur due to a charge gain, without reducing read-out margin and increasing the chip area.

However, depending on the characteristics of the memory cell, the width of the intermediate range within which the value of the standard current is set may become extremely narrow, e.g. 1 µA or less. The deterioration of the characteristics of elements in a reference current generating circuit at EOL leads to a reduction in value of the standard current. As a result, the value of the standard current at EOL may be within the range of the off-cell current distribution, thereby causing a malfunction in reading out an off-cell.

In the method disclosed by Japanese Patent Application Publication 2008-192232, the reference level of the reference cell is used as a standard current to be compared with a cell current. This leads to a problem that if the widths of the on-cell and the off-cell current distributions are increased, it becomes difficult to adjust the reference level within the intermediate range between the lower limit of the on-cell current distribution and the upper limit of the off-cell current distribution.

BRIEF SUMMARY OF THE INVENTION

A reference current generating circuit according to one aspect of the invention includes a first standard current generating circuit to generate a first standard current, a second standard current generating circuit which generates a second standard current and which is operated for a part of an operation period of the first standard current generating circuit, a first trimming circuit to generate a first reference current by trimming a value of the first standard current, a second trimming circuit to generate a second reference current by trimming the value of the second standard current, a comparison circuit to compare a value of the first reference current with a value of the second reference current, a trimming controller to control the trimming of the first trimming circuit so that the value of the first reference current approaches the value of the second reference current.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
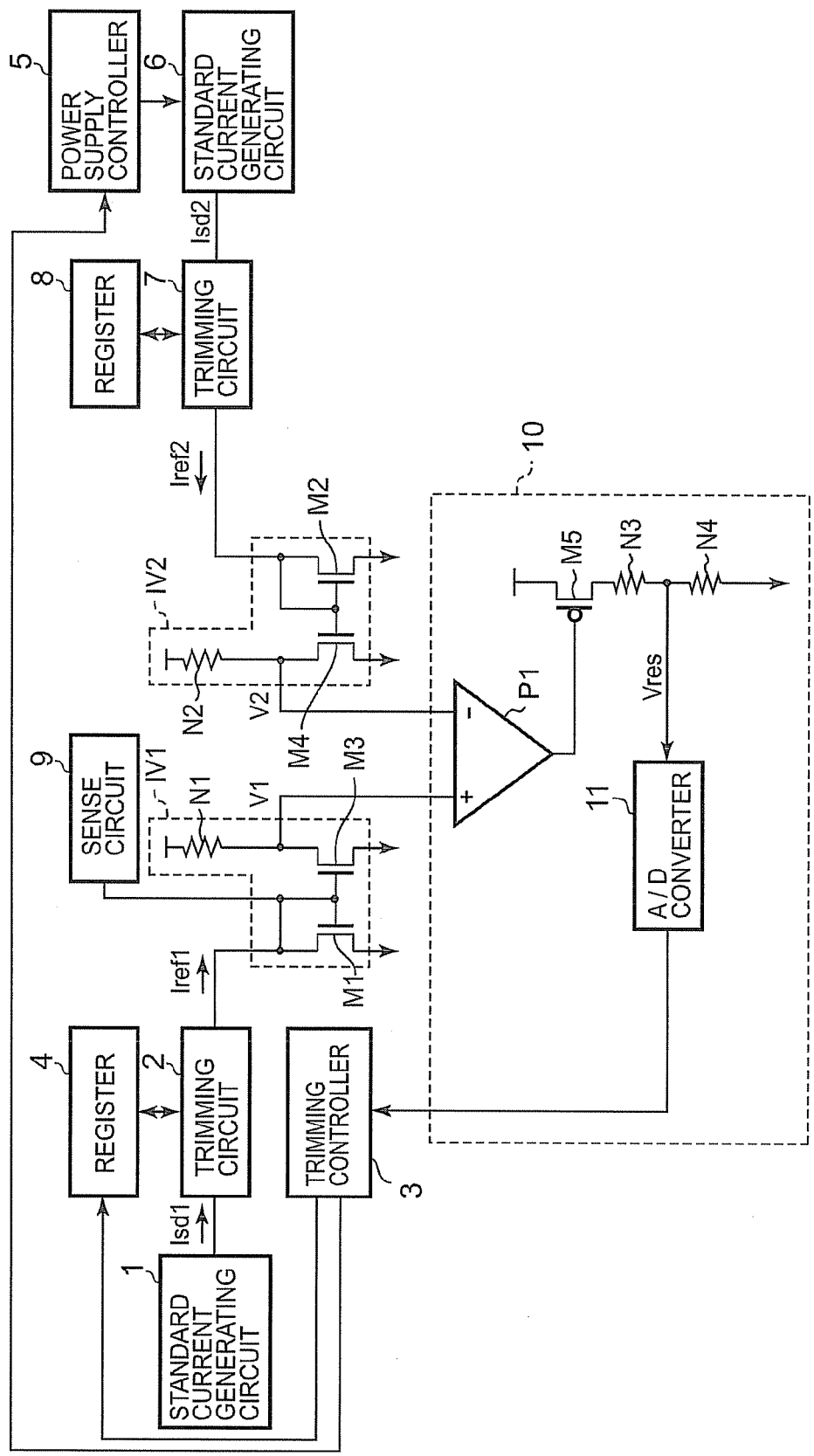
FIG. 1 is a block diagram schematically showing a structure of a reference current generating circuit according to a first embodiment of the invention.

A reference current generating circuit according to an exemplary embodiment of the present invention will now be described with reference to the accompanying drawings wherein the same or like reference numerals designate the same or corresponding parts throughout the several views.

First Embodiment

FIG. 1 is a block diagram schematically showing a structure of a reference current generating circuit according to a first embodiment of the invention. In FIG. 1, the reference current generating circuit includes first and second standard current generating circuits 1, 6, first and second trimming circuits 2, 7, a trimming controller 3, first and second registers 4, 8, a power supply controller 5, a comparison circuit 10, and first and second current/voltage conversion circuits IV1, IV2.

Here, the first standard current generating circuit 1 generates a standard current Isd1. The second standard current generating circuit 6 generates a standard current Isd2. The second standard current generating circuit 6 operates for a part of the operation period of the first standard current generating circuit 1. The first standard current generating circuit 1 always operates, and the second standard current generating circuit 6 operates periodically for only a predetermined period of time upon power-on, for example.

Figure 2:
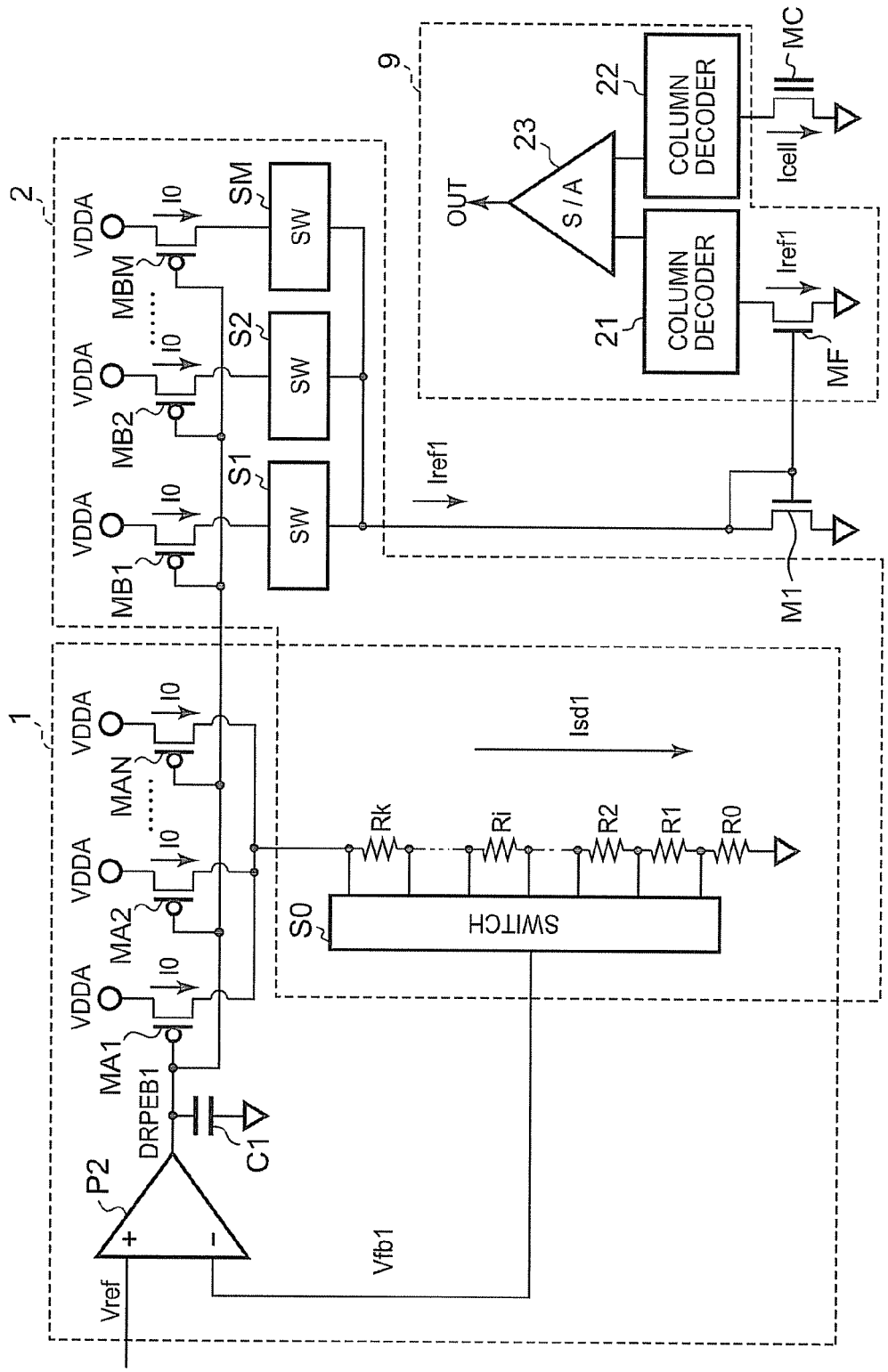
FIG. 2 is a block diagram schematically showing an embodiment of a structure of a first standard current generating circuit and a first trimming circuit used in the reference current generating circuit shown in FIG. 1.
Figure 3:
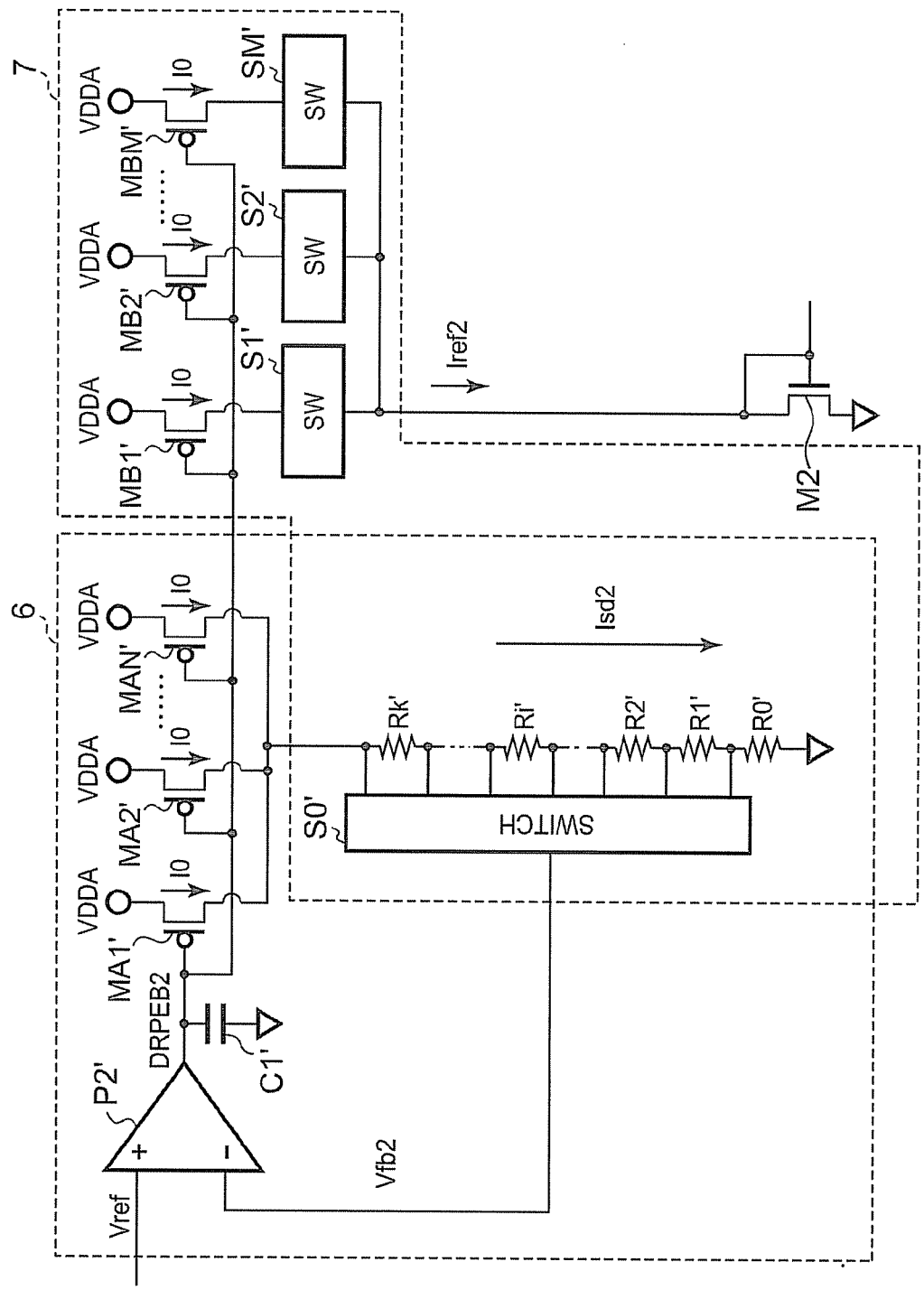
FIG. 3 is a block diagram schematically showing an embodiment of a structure of a second standard current generating circuit and a second trimming circuit used in the reference current generating circuit shown in FIG. 1.

FIG. 2 is a block diagram schematically showing an example of the structure of the first standard current generating circuit and the first trimming circuit, and FIG. 3 is a block diagram schematically showing an example of the structure of the second standard current generating circuit and the second trimming circuit, the circuits being used in the reference current generating circuit shown in FIG. 1.

As shown in FIGS. 2 and 3, the first trimming circuit 2 generates a reference current Iref1 by trimming the value of a standard current Isd1, and the second trimming circuit 7 generates a reference current Iref2 by trimming the value of a standard current Isd2. The first trimming circuit 2 trims the value of the reference current Iref1 by selecting the number of current mirror currents which are generated based on the standard current Isd1. The second trimming circuit 7 trims the value of the reference current Iref2 by selecting the number of current mirror currents which are generated based on the standard current Isd2.

The first current/voltage conversion circuit IV1 converts the reference current Iref1 to a voltage V1. The second current/voltage conversion circuit IV2 converts reference current Iref2 to a voltage V2. Here, the first current/voltage conversion circuit IV1 includes N-channel field effect transistors M1, M3, and a resistor N1. The gate of the N-channel field effect transistor M1 and the gate of the N-channel field effect transistor M3 are connected to the drain of the N-channel field effect transistor M1, and the drain of the N-channel field effect transistor M3 is connected to the resistor N1. The second current/voltage conversion circuit IV2 includes N-channel field effect transistors M2, M4, and a resistor N2. The gate of the N-channel field effect transistor M2 and the gate of the N-channel field effect transistor M4 are connected to the drain of N-channel field effect transistor M2, and the drain of the N-channel field effect transistor M4 is connected to the resistor N2.

The comparison circuit 10 compares the value of the reference current Iref1 with the value of the reference current Iref2. The comparison circuit 10 includes an operational amplifier P1, a P-channel field effect transistor M5, resistors N3, N4, and an A/D converter 11. The non-inverted input terminal of the operational amplifier P1 is connected to the drain of the N-channel field effect transistor M3, and the inverted input terminal of the operational amplifier P1 is connected to the drain of the N-channel field effect transistor M4. The output terminal of the operational amplifier P1 is connected to the gate of the P-channel field effect transistor M5, and the drain of the P-channel field effect transistor M5 is connected to the series circuit of the resistors N3, N4. The connection point between the resistors N3, N4 is connected to the input of the A/D converter 11, and the output of the A/D converter 11 is connected to the trimming controller 3.

The trimming controller 3 controls the trimming performed by the first trimming circuit 2 so that the value of the reference current Iref1 approaches the value of the reference current Iref2. The trimming controller 3 stores the trimming value of the first trimming circuit 2 in the first register 4, when controlling the trimming performed by the first trimming circuit 2.

The first register 4 stores the trimming value of the first trimming circuit 2. Similarly, the second register 8 stores the trimming value of the second trimming circuit 7. As the first register 4, a volatile memory such as DRAM and SRAM may be used. As the second register 8, a nonvolatile memory such as a flash memory represented by EPROM may be used.

The power supply controller 5 controls power supply to the second standard current generating circuit 6. The power supply controller 5 supplies power to the second standard current generating circuit 6 upon power-on, and after the trimming control performed by the first trimming circuit 2 is finished, the power supply controller 5 shuts off the power supply to the second standard current generating circuit 6, for example.

A sense circuit 9 compares a cell current read from a memory cell with the reference current Iref1. When the cell current is greater than the reference current Iref1, the read data is determined to be "1," and when the cell current is smaller than the reference current Iref1, the read data is determined to be "0."

Before the shipment of a product with the reference current generating circuit, power is supplied to the second standard current generating circuit 6 to generate the standard current Isd2 in the second standard current generating circuit 6. Then the standard current Isd2, which is generated in the second standard current generating circuit 6, is trimmed by the second trimming circuit 7 to generate the reference current Iref2. Then the reference current Iref2 is monitored, and a trimming value used by the second trimming circuit 7 is adjusted so that the reference current Iref2 becomes equal to a set current. The resultant trimming value is stored in the second register 8.

After the product shipment, when the reference current generating circuit is powered on, power is supplied to the second standard current generating circuit 6 and the standard current Isd2 is thereby generated in the second standard current generating circuit 6. Then the trimming value to be used by the second trimming circuit 7 is adjusted to the value stored in the second register 8. Thereafter, the standard current Isd2 generated in the second standard current generating circuit 6 is trimmed by the second trimming circuit 7 and the reference current Iref2 equal to the set current is thereby generated. Then after the reference current Iref2 is converted to the voltage V2 in the second current/voltage conversion circuit IV2, the voltage V2 is inputted to the inverted input terminal of the operational amplifier P1.

After the product shipment, when the reference current generating circuit is powered on, the standard current Isd1 is also generated in the first standard current generating circuit 1. Then the standard current Isd1 generated in the first standard current generating circuit 1 is trimmed by the first trimming circuit 2 to generate the reference current Iref1. Then after the reference current Iref1 is converted to the voltage V1 in the first current/voltage conversion circuit IV1, the voltage V1 is inputted to the non-inverted input terminal of the operational amplifier P1.

The voltage V1 is then compared with the voltage V2 in the operational amplifier P1, and a voltage according to the difference between the voltage V1 and the voltage V2 is inputted to the gate of the P-channel field effect transistor M5. When the voltage according to the difference between the voltage V1 and the voltage V2 is inputted to the gate of P-channel field effect transistor M5, a current according to the difference flows through the series circuit of the resistors N3, N4. This causes a voltage Vres according to the difference generated at the connection point between the resistors N3, N4, and the voltage Vres is inputted to the A/D converter 11. After the voltage Vres is converted to a digital value in the A/D converter 11, the digital value is inputted to the trimming controller 3.

When the digital value of the voltage Vres is inputted to the trimming controller 3, a trimming value to be used by the first trimming circuit 2 is adjusted so that the voltage Vres approaches 0. The resultant trimming value is stored in the first register 4.

When the trimming value of the first trimming circuit 2 is stored in the first register 4, the standard current Isd1 generated in the first standard current generating circuit 1 is trimmed in the first trimming circuit 2 and the reference current Iref1 equal to the set current is thereby generated. The reference current Iref1 is supplied to the sense circuit 9, and a cell current read from a memory cell is compared with the reference current Iref1.

When the trimming value of the first trimming circuit 2 is adjusted in the trimming controller 3 so that the voltage Vres approaches 0, a trimming adjustment completion signal is outputted to the power supply controller 5. When the trimming adjustment completion signal is outputted to the power supply controller 5, the power supply to the second standard current generating circuit 6 is shut off.

As described above, an operation of the second standard current generating circuit 6 for only a predetermined period of time upon power-on enables the reference current Iref1 supplied to the sense circuit 9 to be made equal to the set current, while constantly supplying the reference current Iref1 from the first standard current generating circuit 1 to the sense circuit 9. Thus, even if the first standard current generating circuit 1 deteriorates over a period of time, aged deterioration of the second standard current generating circuit 6 can be reduced, and a deviation of the standard current from the set current due to the aged deterioration of the first standard current generating circuit 1 can be compensated.

In FIG. 2, the first standard current generating circuit 1 includes an operational amplifier P2, N (N is a positive integer) P-channel field effect transistors MA1 to MAN, and a capacitor C1. The first trimming circuit 2 includes k (k is a positive integer) resistors R0 to Rk, a switch S0, M (M is a positive integer) P-channel field effect transistors MB1 to MBM, and M switches S1 to SM. The sense circuit 9 includes an N-channel field effect transistor MF, column decoders 21, 22, and a sense amplifier 23. It is preferable to match the characteristics of the P-channel field effect transistors MA1 to MAN to those of the P-channel field effect transistors MB1 to MBM by designing the size and shape of the P-channel field effect transistors MA1 to MAN to be same as those of the P-channel field effect transistors MB1 to MBM, and arranging the two types of transistors closely to each other on a same semiconductor chip.

The resistors R0 to Rk are connected in series to each other, and all terminals of the resistors R0 to Rk are connected to the input terminal of the switch S0, while the output terminal of the switch S0 is connected to the inverted input terminal of the operational amplifier P2. The switch S0 selects one of the terminals of the resistors R0 to Rk, and connects the selected terminal to the inverted input terminal of the operational amplifier P2. The output terminal of the operational amplifier P2 is connected to the capacitor C1 as well as to the gates of the respective P-channel field effect transistors MA1 to MAN, MB1 to MBM.

The sources of the P-channel field effect transistors MA1 to MAN, MB1 to MBM are connected to a power supply potential VDDA, and the drains of the P-channel field effect transistors MA1 to MAN are connected to a series circuit of the resistors R0 to Rk. The drains of the P-channel field effect transistors MB1 to MBM are connected to the drain of the N-channel field effect transistor M1 via the switches S1 to SM, respectively.

The drain of the N-channel field effect transistor M1 is connected to the gates of the N-channel field effect transistors M1, MF. The drain of the N-channel field effect transistor MF is inputted to one input terminal of the sense amplifier 23 via the column decoder 21, while the drain of a memory cell MC is inputted to the other input terminal of the sense amplifier 23 via the column decoder 22. A flash memory, a ferroelectric memory, or an EEPROM may be used as the memory cell MC.

The second standard current generating circuit 6 and the second trimming circuit 7 that are used in the reference current generating circuit shown in FIG. 1 can be configured similar to the first standard current generating circuit 1 and the first trimming circuit 2, respectively.

In FIG. 3, the second standard current generating circuit 6 includes an operational amplifier P2', N P-channel field effect transistors MA1' to MAN', and a capacitor C1'. The second trimming circuit 7 includes k resistors R0' to Rk', a switch S0', M P-channel field effect transistors MB1' to MBM', and M switches S1' to SM'. It is preferable to match the characteristics of the P-channel field effect transistors MA1' to MAN' to those of the P-channel field effect transistors MB1' to MBM' by designing the size and shape of the P-channel field effect transistors MA1' to MAN' to be same as those of the P-channel field effect transistors MB1' to MBM', and arranging the two types of transistors closely to each other on a same semiconductor chip.

The resistors R0' to Rk' are connected in series to each other, and all terminals of the resistors R0' to Rk' are connected to the switch S0', while the output terminal of switch S0' is connected to an inverted input terminal of the operational amplifier P2'. The switch S0' selects one of the terminals of the resistors R0' to Rk', and connects the selected terminal to the inverted input terminal of the operational amplifier P2'. The output terminal of the operational amplifier P2' is connected to the capacitor C1' as well as to the gates of the P-channel field effect transistors MA1' to MAN', MB1' to MBM'.

The sources of the P-channel field effect transistors MA1' to MAN', MB1' to MBM' are connected to a power supply potential VDDA, and the drains of the P-channel field effect transistors MA1' to MAN' are connected to a series circuit of the resistors R0' to Rk'. The drains of the P-channel field effect transistors MB1' to MBM' are connected to the drain of the N-channel field effect transistor M2 via the switches S1' to SM', respectively.

In the case of adjusting the reference current Iref2 of the second standard current generating circuit 6 so as to be equal to the set current before shipment of the products, the standard current Isd2 is generated by supplying the power supply potential VDDA to the sources of the P-channel field effect transistors MA1' to MAN', MB1 to MBM'. Note that the set current is desirably set within an intermediate range between the lower limit of the on-cell current distribution and the upper limit of the off-cell current distribution.

Then the standard current Isd2 generated in the second standard current generating circuit 6 flows through the resistors R0' to Rk'. Subsequently, a divided voltage Vfb2 divided by the resistors R0' to Rk' is inputted to the inverted input terminal of the operational amplifier P2' via the switch S0' and is compared with a reference voltage Vref, which has been inputted to the non-inverted input terminal of the operational amplifier P2'. A band-gap reference voltage may be used as the reference voltage Vref, for example, since the band-gap reference voltage has less aged deterioration over the product life of the reference current generating circuit and has less source voltage dependency and temperature dependency.

An output voltage DRPEB2 is generated according to the difference between the divided voltage Vfb2 and the reference voltage Vref in the operational amplifier P2', and is applied to the gates of the P-channel field effect transistors MA1' to MAN', MB1' to MBM'. If the P-channel field effect transistors MA1' to MAN', MB1' to MBM' have the same characteristics, applying the same output voltage DRPEB2 to the gates of P-channel field effect transistors MA1' to MAN', MB1' to MBM' causes the P-channel field effect transistors MA1' to MAN', MB1' to MBM' to generate the drain currents I0 with the same value.

Then respective drain currents I0 generated by the P-channel field effect transistors MA1' to MAN' flow in the series circuit of the resistors R0' to Rk' to generate the standard current Isd2.

The drain currents I0 generated in the respective P-channel field effect transistors MB1' to MBM' merge together via the switches S1' to SM', respectively, to generate the reference current Iref2, which is supplied to the N-channel field effect transistor M2.

The reference current Iref2 is monitored, and each of the switches S0', S1' to SM' is turned on or off so that the reference current Iref2 becomes equal to the set current. Thus, the trimming value to be used by the second trimming circuit 7 can be adjusted.

After the product shipment, when the reference current generating circuit is powered on, the power supply potential VDDA is supplied to the sources of the P-channel field effect transistors MA1' to MAN', MB1' to MBM'. Turning each of the switches S0', S1' to SM' on or off according to the value stored in the second register 8 causes the standard current Isd2 and the reference current Iref2 to be generated so that both currents are equal to the set current. Then the reference current Iref2 is supplied to the N-channel field effect transistor M2.

After the product shipment, when the reference current generating circuit is powered on, supplying the power supply potential VDDA to the sources of the P-channel field effect transistors MA1 to MAN, MB1 to MBM in FIG. 2 causes the standard current Isd1 to be generated.

Then the standard current Isd1 generated in the first standard current generating circuit 1 flows through the resistors R0 to Rk. Subsequently, a divided voltage Vfb1 divided by the resistors R0 to Rk is inputted to the inverted input terminal of the operational amplifier P2 via the switch S0 and is compared with the reference voltage Vref, which has been inputted to the non-inverted input terminal of the operational amplifier P2.

An output voltage DRPEB1 is generated according to the difference between the divided voltage Vfb1 and the reference voltage Vref in the operational amplifier P2, and is applied to the gates of the P-channel field effect transistors MA1 to MAN, MB1 to MBM. If the P-channel field effect transistors MA1 to MAN, MB1 to MBM have the same characteristics, applying the same output voltage DRPEB1 to the gates of the P-channel field effect transistors MA1 to MAN, MB1 to MBM causes the P-channel field effect transistors MA1 to MAN, MB1 to MBM to generate the drain currents I0 with the same value.

Then respective drain currents I0 generated in the P-channel field effect transistors MA1 to MAN flow in the series circuit of the resistors R0 to Rk to generate the standard current Isd1.

The drain currents I0 generated in the respective P-channel field effect transistors MB1 to MBM merge together via the switches S1 to SM, respectively, to generate the reference current Iref1, which is supplied to the N-channel field effect transistor M1.

When supplied to the N-channel field effect transistors M1, M2, the reference currents Iref1, Iref1 are converted to the voltages V1, V2 in the first and second current/voltage conversion circuits IV1, IV2 shown in FIG. 1, respectively, and are inputted to the comparison circuit 10.

Then the voltage V1 is compared with the voltage V2 in the comparison circuit 10, and a digital value of the voltage Vres according to the difference between the voltage V1 and the voltage V2 is inputted to the trimming controller 3. Each of the switches S0, S1 to SM is turned on or off so that the voltage Vres approaches 0 in the trimming controller 3. Thus, the trimming value to be used by the first trimming circuit 2 is adjusted. The resultant trimming value is stored in the first register 4.

When the trimming value of the first trimming circuit 2 is stored in the first register 4, the standard current Isd1 generated in the first standard current generating circuit 1 is trimmed in the first trimming circuit 2 and the reference current Iref1 equal to the set current is thereby generated.

When the reference current Iref1 is supplied to the N-channel field effect transistor M1, the reference current Iref1 flows through the N-channel field effect transistor MF due to current mirror operation between the N-channel field effect transistors M1, MF, and is inputted to one input terminal of the sense amplifier 23 via the column decoder 21.

A cell current Icell read from the memory cell MC is inputted to the other input terminal of the sense amplifier 23 via the column decoder 22. Then, the cell current Icell is compared with the reference current Iref1 in the sense amplifier 23. When the cell current Icell is greater than the reference current Iref1, the read data is determined to be "1," and when the cell current Icell is smaller than the reference current Iref1, the read data is determined to be "0."

When each of the switches S0, S1 to SM is turned on or off so that the voltage Vres approaches 0, a trimming adjustment completion signal is outputted from the trimming controller 3 to the power supply controller 5. When the trimming adjustment completion signal is outputted to the power supply controller 5, the power supply potential VDDA, which has been supplied to the sources of the P-channel field effect transistors MA1' to MAN', MB1' to MBM', is shut off.

In the above description, the P-channel field effect transistors MB1 to MBM perform current mirror operations on the basis of the output voltage DRPEB1, and the number of the drain currents I0 allowed to flow through the P-channel field effect transistors MB1 to MBM is selected so that the reference current Iref1, Iref1 are equal to each other. Thus, even in the case where deterioration of the characteristics of the circuit component occurs at EOL, it is possible to adjust the value of the reference current Iref1 within the intermediate range between the lower limit of the on-cell current distribution and the upper limit of the off-cell current distribution.

Figure 4:
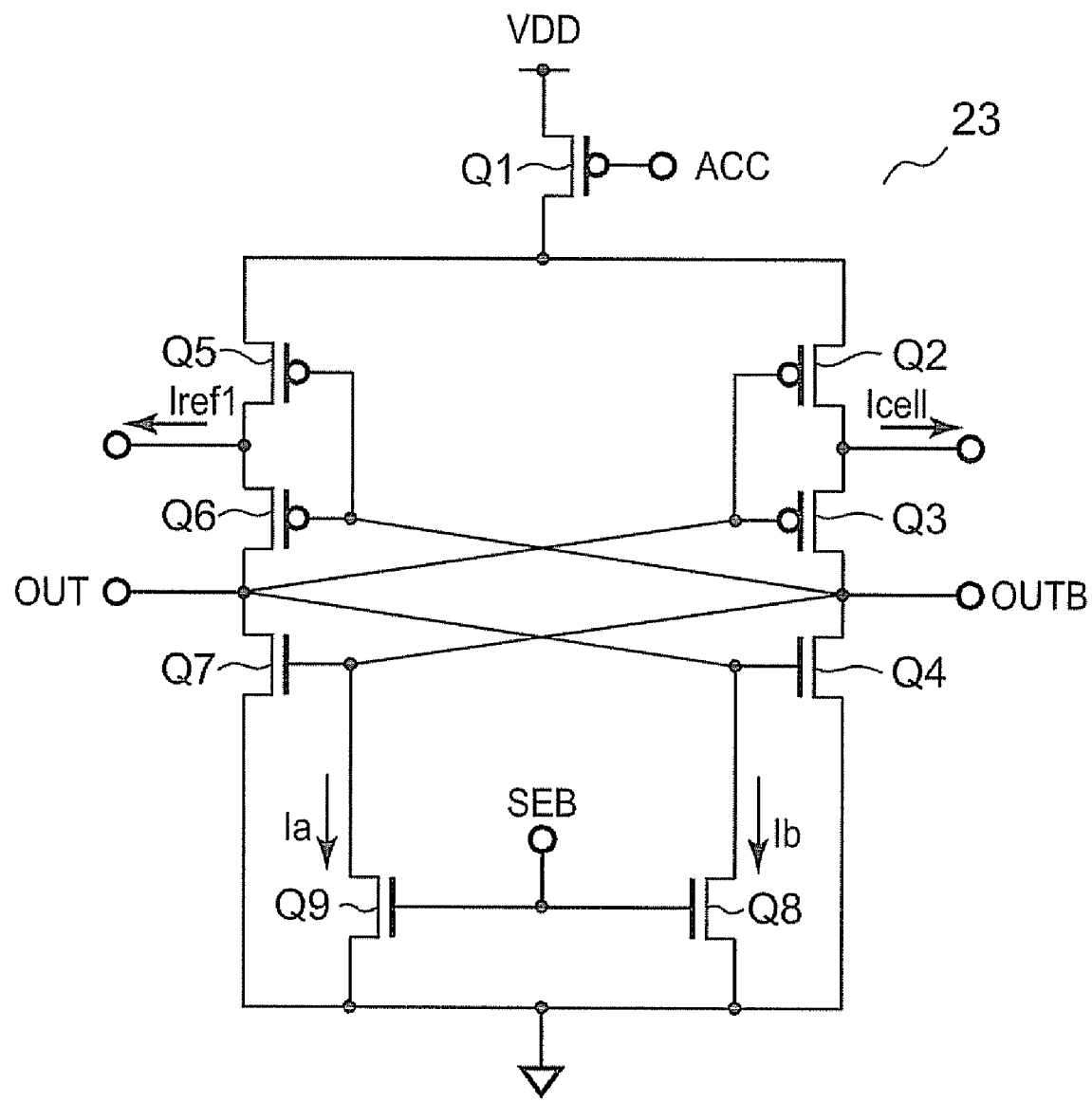
FIG. 4 is a circuit diagram schematically showing an embodiment of a structure of a sense amplifier used in the reference current generating circuit shown in FIG. 2.

FIG. 4 is a circuit diagram schematically showing an example of the structure of the sense amplifier 23 shown in FIG. 2.

In FIG. 4, the sense amplifier 23 includes N-channel field effect transistors Q4, Q7 to Q9 and P-channel field effect transistors Q1 to Q3, Q5, Q6.

A first CMOS inverter is configured by connecting the drain of the N-channel field effect transistor Q4 and the drain of the P-channel field effect transistor Q3 to each other, and by connecting the gate of the N-channel field effect transistor Q4 and the gate of the P-channel field effect transistor Q3 to each other. Similarly, a second CMOS inverter is configured by connecting the drain of the N-channel field effect transistor Q7 and the drain of the P-channel field effect transistor Q6 to each other, and by connecting the gate of the N-channel field effect transistor Q7 and the gate of the P-channel field effect transistor Q6 to each other.

The drain of the N-channel field effect transistor Q4 and the drain of the P-channel field effect transistor Q3 are connected to the gate of the N-channel field effect transistor Q7 and the gate of the P-channel field effect transistor Q6. A flip flop is configured by connecting the drain of N-channel field effect transistor Q7 and the drain of the P-channel field effect transistor Q6 to the gate of the N-channel field effect transistor Q4 and the gate of the P-channel field effect transistor Q3.

The P-channel field effect transistor Q5 is connected to the P-channel field effect transistor Q6 in series, and the gate of the P-channel field effect transistor Q5 is connected to the gate of the P-channel field effect transistor Q6. The P-channel field effect transistor Q2 is connected to the P-channel field effect transistor Q3 in series, and the gate of the P-channel field effect transistor Q2 is connected to the gate of the P-channel field effect transistor Q3. The sources of the P-channel field effect transistors Q2, Q5 are connected to the power supply potential VDD via the P-channel field effect transistor Q1.

The drain of the N-channel field effect transistor Q9 is connected to the gate of the N-channel field effect transistor Q7, and the drain of the N-channel field effect transistor Q8 is connected to the gate of the N-channel field effect transistor Q4. The gates of the N-channel field effect transistors Q8, Q9 are connected to each other, and the sources of the N-channel field effect transistors Q4, Q7, Q8, Q9 are connected to each other.

The cell current Icell is inputted to the connection point between the drain of the P-channel field effect transistor Q2 and the source of the P-channel field effect transistor Q3. The reference current Iref1 is inputted to the connection point between the drain of the P-channel field effect transistor Q5 and the source of the P-channel field effect transistor Q6. An ACC signal is inputted to the gate of the P-channel field effect transistor Q1 and the P-channel field effect transistor Q1 forms a current source.

An output signal OUT is outputted from the connection point between the drain of the P-channel field effect transistor Q6 and the drain of the N-channel field effect transistor Q7. An output signal OUTB is outputted from the connection point between the drain of the P-channel field effect transistor Q3 and the drain of the N-channel field effect transistor Q4.

A sense amplifier enable signal SEB is supplied to the gates of the N-channel field effect transistors Q8, Q9. When the state of the sense amplifier enable signal SEB changes from high to low, the sense amplifier 23 in FIG. 4 performs a sensing operation. The sense amplifier 23 in FIG. 4 performs current sensing while the voltage level of the sense amplifier enable signal SEB is high, and performs voltage sensing while the voltage level of the sense amplifier enable signal SEB is low.

The initial state (before a sensing operation is started) of the sense amplifier enable signal SEB is high. Accordingly, the N-channel field effect transistors Q8, Q9 are turned on, and currents Ib, Ia flowing through the respective N-channel field effect transistors Q8, Q9 are equal. At this point, the output signals OUT and OUTB are both low, the N-channel field effect transistors Q4, Q7 are both turned off, and all of the P-channel field effect transistors Q2, Q3, Q5, and Q6 are turned on. Accordingly, a portion of the current from the P-channel field effect transistor Q1 flows toward the memory cell MC in FIG. 2, and the remaining portion of the current flows to the ground terminal through the P-channel field effect transistor Q3 and the N-channel field effect transistor Q9. Similarly, a portion of the current from the P-channel field effect transistor Q1 flows toward the N-channel field effect transistor MF, and the remaining portion of the current flows to the ground terminal through the P-channel field effect transistor Q6 and the N-channel field effect transistor Q8.

Subsequently, when the voltage level of the sense amplifier enable signal SEB gradually decreases, the N-channel field effect transistors Q8, Q9 is operated so as to be turned off, and the drain-source resistance of the respective N-channel field effect transistors Q8, Q9 increases. Accordingly, the current does not flow easily between the drain and the source of each of the N-channel field effect transistors Q8, Q9. Thus, the difference between the current Ib flowing through the N-channel field effect transistor Q8 and the current Ia flowing through the N-channel field effect transistor Q9 (Ib−Ia) becomes greater than the difference between the cell current Icell and the reference current Iref1 (Icell−Iref1). This operation is called a current sensing. In the case of Icell>Iref1, for example, (Ib−Ia) gradually increases due to the current sensing.

When the voltage level of the sense amplifier enable signal SEB further decreases, the current Ib becomes substantially greater than the current Ia, and accordingly the drain-source resistance of the respective N-channel field effect transistors Q8, Q9 also increases. Thus, the gate voltage level of the N-channel field effect transistor Q4, i.e., the voltage level of the output signal OUT increases, and the N-channel field effect transistor Q4 is operated so as to be turned on. Accordingly, the voltage level of the output signal OUTB decreases and the difference between the voltage levels of the output signals OUT and OUTB gradually increases. This operation is called a voltage sensing. In the case of Icell>Iref1, the output signal OUT becomes high, and the output signal OUTB becomes low as a result of amplified voltage level difference between the output signals OUT and OUTB, and thus the logic is determined.

Second Embodiment

Figure 5:
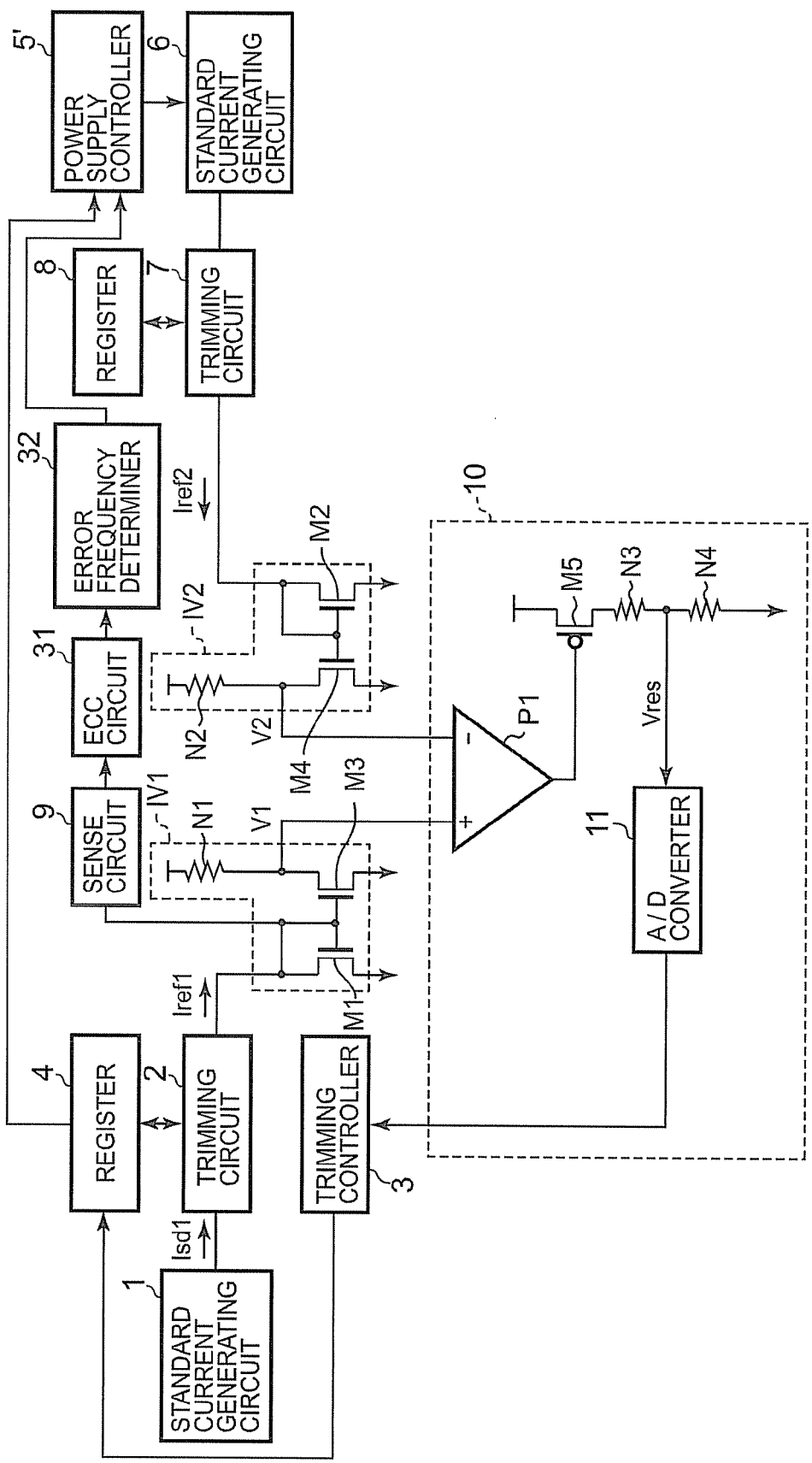
FIG. 5 is a block diagram schematically showing a structure of a reference current generating circuit according to a second embodiment of the invention.

FIG. 5 is a block diagram schematically showing a structure of a reference current generating circuit according to a second embodiment of the invention.

In addition to the structure of the reference current generating circuit in FIG. 1, the reference current generating circuit in FIG. 5 includes an error correction circuit 31 and an error frequency determiner 32. The error correction circuit 31 corrects error data read from the memory cell MC in FIG. 2. The error frequency determiner 32 determines an error frequency on the basis of a result of a correction performed by the error correction circuit 31.

After the product shipment, when the reference current generating circuit is powered on, a reference current Iref1 trimmed in a first trimming circuit 2 is supplied to a sense circuit 9. In the sense circuit 9, a cell current Icell read from a memory cell MC in FIG. 2 is compared with the reference current Iref1. When the cell current Icell is greater than the reference current Iref1, the read data is determined to be "1,"

while when the cell current Icell is smaller than the reference current Iref1, the read data is determined to be "0."

The determination result by the sense circuit 9 is outputted to the error correction circuit 31. If the determination result by the sense circuit 9 has an error, correction of the error data is made. When the correction of the error data is made in the error correction circuit 31, the error frequency is determined in the error frequency determiner 32. If the error frequency is not more than a predetermined value, the power supply to a second standard current generating circuit 6 is stopped in a power supply controller 5 to maintain a state in which a reference current Iref2 is not generated.

On the other hand, if the error frequency exceeds the predetermined value, the power supply to the second standard current generating circuit 6 is performed in the power supply controller 5, and the reference current Iref2 trimmed in a second trimming circuit 7 is supplied to a second current/voltage conversion circuit IV2.

Then in a comparison circuit 10, voltages V1, V2 which have been generated in the first and the second current/voltage conversion circuits IV1 and IV2, respectively, are compared with each other. A digital value of a voltage Vres according to the difference between the voltages V1, V2 is inputted to a trimming controller 3. In the trimming controller 3, the trimming value of the first trimming circuit 2 is adjusted so that the voltage Vres approaches 0, and the resultant trimming value is stored in a first register 4.

When the trimming value of the first trimming circuit 2 is stored in the first register 4, a standard current Isd1 generated in a first standard current generating circuit 1 is trimmed in the first trimming circuit 2 so that the reference current Iref1 is corrected to be equal to the set current.

Here, the error frequency determiner 32 determines an error frequency. This allows a deviation of the reference current Iref1 from a preset value due to aged deterioration to be detected, and the reference current Iref1 to be compensated according to the deviation. Also, if the deviation of the reference current Iref1 from the preset value is small, the second standard current generating circuit 6 can be controlled so as not to start operation. Thus, even if the first standard current generating circuit 1 deteriorates over a period of time, progress of aged deterioration of the second standard current generating circuit 6 can be reduced. Furthermore, even if the reference current generating circuit is used in an environment where the power supply is always left turned on, the deviation of the standard current from the set current due to the aged deterioration of the first standard current generating circuit 1 can be compensated.

The present invention is not limited directly to the above described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined. It is to therefore be understood that within the scope of the appended claims, the present invention may be practiced other than as specifically disclosed herein.

What is claimed is:

1. A reference current generating circuit comprising:
    a first standard current generating circuit to generate a first standard current;
    a second standard current generating circuit to generate a second standard current by operating for a part of an operation period of the first standard current generating circuit;
    a first trimming circuit to generate a first reference current by trimming the value of the first standard current;
    a second trimming circuit to generate a second reference current by trimming the value of the second standard current;
    a comparison circuit to compare a value of the first reference current with a value of the second reference current; and
    a trimming controller to control the trimming of the first trimming circuit so that the value of the first reference current approaches the value of the second reference current.

2. The reference current generating circuit according to claim 1, wherein each of the first and second trimming circuits includes;
    M first field effect transistors (M is an integer not less than 2) conducting mirror operation based on the first standard current, and
    a switch to select the first field effect transistors to generate the first and second reference currents by merging current through the selected first field effect transistors, respectively.

3. The reference current generating circuit according to claim 2, wherein each of the first and second standard current generating circuits includes;
    an operational amplifier to receive a reference voltage at one input terminal,
    a second field effect transistor having a gate and drain, an output of the operational amplifier being applied to the gate, and
    k resistors (k is an integer not less than 2) connected in series to the drain of the second field effect transistor and feed backing a voltage at one of connection points of the resistors to the other input terminal of the operational amplifier.

4. The reference current generating circuit according to claim 3, wherein each of the first and second standard current generating circuits includes a capacitor connected to the gate of the second field effect transistor.

5. The reference current generating circuit according to claim 3, wherein the size and shape of the first field effect transistor are the same as those of the second field effect transistor.

6. The reference current generating circuit according to claim 1, further including a first resister to store the trimming value of the first trimming circuit and a second resister to store the trimming value of the second trimming circuit.

7. The reference current generating circuit according to claim 6, wherein the first and second resisters are formed of a volatile memory and a non-volatile memory, respectively.

8. The reference current generating circuit according to claim 7, wherein the volatile memory is DRAM or SRAM, and the non-volatile memory is a flash memory, respectively.

9. The reference current generating circuit according to claim 1, further including a power supply controller to supply a power to the second standard current generating circuit when the power is on, and shuts the power supply to the second standard current generating circuit after the trimming control by the trimming circuit has finished.

10. The reference current generating circuit according to claim 1, wherein the comparison circuit includes an operational amplifier and an A/D converter to convert the output of the operational amplifier to digital signal, and the A/D converter is connected to the trimming controller.

11. The reference current generating circuit according to claim 10, wherein the comparison circuit includes a third field effect transistor having a drain and a gate to receive the output of the operational amplifier, and at least two resistors connected to the drain in series, and either one of connection points of the resistors is connected to an input terminal of the A/D converter.

12. The reference current generating circuit according to claim 11, further including first and second current/voltage conversion circuits to convert the first and second reference currents to voltages, respectively, and the outputs of the first and second current/voltage conversion circuits are applied to the operational amplifier in the comparison circuit.

13. The reference current generating circuit according to claim 1, further including a sense circuit connected to the first trimming circuit to determine the read data from a memory cell by comparing the first reference current and the cell current, when the cell current is greater than the first reference current, the read data is "1", and when the cell current is smaller than the first reference current, the read data is "0".

14. The reference current generating circuit according to claim 13, wherein the sense circuit includes a sense amplifier switched between a voltage sense or a current sense by a sense enable signal.

15. A reference current generating circuit comprising:
a first standard current generating circuit to generate a first standard current;
a second standard current generating circuit to generate a second standard current by operating for a part of an operation period of the first standard current generating circuit;
a first trimming circuit to generate a first reference current by trimming the value of the first standard current;
a second trimming circuit to generate a second reference current by trimming the value of the second standard current;
a comparison circuit to compare the value of the first reference current with the value of the second reference current;
a trimming controller to control the trimming of the first trimming circuit so that the value of the first reference current approaches the value of the second reference current;
a sense circuit to compare the first reference current with a cell current read from a memory cell;
an error correction circuit to correct error data read from the memory cell;
an error frequency determiner to determine the error frequency based on the corrected result by the error correction circuit; and
a power supply controller to control power supply to the second standard current generating circuit based on the decision by the error frequency determiner.

16. The reference current generating circuit according to claim 15, wherein each of the first and second trimming circuits includes;
M field effect transistors (M is an integer not less than 2) conducting mirror operation based on the first standard current, and
a switch to select the field effect transistors to generate the first and second reference currents by merging current through the selected field effect transistors, respectively.

17. The reference current generating circuit according to claim 15, further comprising a first resister to store the trimming value of the first trimming circuit and a second resister to store the trimming value of the second trimming circuit.

18. The reference current generating circuit according to claim 15, wherein if the error frequency determined by the error frequency determiner is not more than a predetermined value, the power supply to the second standard current generating circuit is stopped by the power supply controller to maintain a state in which the second reference current is not generated.

19. The reference current generating circuit according to claim 15, wherein if the error frequency determined by the error frequency determiner exceeds the predetermined value, the power supply to the second standard current generating circuit is performed by the power supply controller, and the second reference current trimmed in a second trimming circuit is generated.

* * * * *